US008626098B1

(12) United States Patent
Livezey

(10) Patent No.: US 8,626,098 B1
(45) Date of Patent: Jan. 7, 2014

(54) AUTOMATIC GAIN CONTROL WITH PROGRAMMABLE ATTACK AND DECAY TIMES

(71) Applicant: Darrell Lee Livezey, Auburn, CA (US)

(72) Inventor: Darrell Lee Livezey, Auburn, CA (US)

(73) Assignee: Tahoe RF Semiconductor, Inc., Auburn, CA (US)

( * ) Notice: Subject to any disclaimer, the term of this patent is extended or adjusted under 35 U.S.C. 154(b) by 0 days.

(21) Appl. No.: 13/629,633

(22) Filed: Sep. 28, 2012

(51) Int. Cl.
*H04B 1/06* (2006.01)

(52) U.S. Cl.
USPC ........ 455/240.1; 455/136; 455/138; 455/219; 455/232.1; 455/245.1; 330/9; 330/51; 330/85; 330/253; 330/254

(58) Field of Classification Search
USPC ........... 455/130, 136, 138, 219, 232.1, 234.1, 455/245.1, 247.1, 251.1, 340, 341, 241.1; 330/9, 51, 85, 253, 254
See application file for complete search history.

(56) References Cited

U.S. PATENT DOCUMENTS

| | | | | |
|---|---|---|---|---|
| 2002/0149423 A1* | 10/2002 | Prentice et al. | ................. | 330/85 |
| 2004/0014450 A1* | 1/2004 | Yamamoto et al. | ........... | 455/307 |
| 2007/0098118 A1* | 5/2007 | Muhammad et al. | ......... | 375/344 |

* cited by examiner

*Primary Examiner* — Tuan Pham
(74) *Attorney, Agent, or Firm* — Raj Abhyanker, P.C.

(57) ABSTRACT

A transconductance comparator includes a comparator having an output of a detector configured to sense an amplitude of an output of a Variable Gain Amplifier (VGA) of a receiver as a first input and a reference amplitude level as a second input. The comparator generates an error signal based on the first input and the second input. The transconductance comparator also includes a transconductance amplifier having a differential voltage input based on the error signal generated through the comparator and generating an output current. The transconductance amplifier includes current sources associated with programmable current limits thereof and differential pairs associated with the current sources, one or more of which is implemented with a size mismatch between transistors thereof to eliminate an offset error due to a mismatch between the current limits, thereby enabling programmability of an attack time and a decay time during automatic gain control of the VGA.

20 Claims, 4 Drawing Sheets

AUTOMATIC GAIN CONTROL WITH PROGRAMMABLE ATTACK AND DECAY TIMES

FIELD OF TECHNOLOGY

This disclosure relates generally to automatic gain control circuits in Radio Frequency (RF) receivers and, more particularly, to automatic gain control with programmable attack and decay times.

BACKGROUND

An Automatic Gain Control (AGC) circuit may be required when amplitude of an input signal of a Radio Frequency (RF) receiver varies over a wide dynamic range to provide a relatively constant amplitude so that circuitry of the RF receiver following the AGC circuit requires lesser dynamic range. For example, anti-jamming receivers may require the AGC circuit therein to be capable of increasing the amplitude of the input signal at one rate, and decreasing the amplitude at a significantly different rate. Attack time may refer to the time in which the AGC circuit decreases the gain of one or more Variable Gain Amplifiers (VGAs) in the RF receiver when an unwanted signal appears, and decay time refers to the time in which the AGC circuit increases the gain of the one or more VGAs when the unwanted signal disappears.

A transconductance amplifier utilized in the AGC circuit may have an input offset that is strongly dependent on the ratio of current limits thereof. Moderate differences between the positive and the negative current limits of the transconductance amplifier may generate large offsets, thereby causing serious errors in the amplitude control. The amplitude control errors may degrade the overall performance of the RF receiver.

SUMMARY

A method, a circuit and/or a system of automatic gain control with programmable attack and decay times are disclosed.

In one aspect, a transconductance comparator includes a comparator having an output of a detector configured to sense an amplitude of an output of a Variable Gain Amplifier (VGA) of a receiver as a first input and a reference amplitude level as a second input thereto. The comparator is configured to generate an error signal based on the first input and the second input. The transconductance comparator also includes a transconductance amplifier configured to have a differential voltage input based on the error signal generated through the comparator and to generate an output current. The transconductance amplifier includes a first current source associated with a programmable lower current limit of the transconductance amplifier, and a second current source associated with a programmable upper current limit of the transconductance amplifier.

The transconductance amplifier also includes a first differential pair coupled to the first current source and configured to have a first voltage of the differential voltage input applied to gate terminals of transistors thereof, and a second differential pair coupled to the second current source and configured to have a second voltage of the differential voltage input applied to gate terminals of transistors thereof. The transistors of the first differential pair and/or the transistors of the second differential pair are implemented with a size mismatch therebetween to eliminate an offset error in the transconductance amplifier due to a mismatch between the programmable lower current limit and the programmable upper current limit. The elimination of the offset error enables programmability of an attack time and a decay time during automatic gain control of the VGA over a wide range of the programmable current limits of the transconductance amplifier.

In another aspect, an automatic gain control circuit of a VGA includes a detector to sense an amplitude of an output of the VGA, and a comparator having an output of the detector as a first input and a reference amplitude level as a second input thereto. The comparator is configured to generate an error signal based on the first input and the second input. The automatic gain control circuit also includes a transconductance amplifier configured to have a differential voltage input based on the error signal generated through the comparator and to generate an output current. An output of the transconductance amplifier is configured to be applied to the VGA to effect an automatic gain control.

The transconductance amplifier includes a first current source associated with a programmable lower current limit of the transconductance amplifier, and a second current source associated with a programmable upper current limit of the transconductance amplifier. The transconductance amplifier also includes a first differential pair coupled to the first current source and configured to have a first voltage of the differential voltage input applied to gate terminals of transistors thereof, and a second differential pair coupled to the second current source and configured to have a second voltage of the differential voltage input applied to gate terminals of transistors thereof. The transistors of the first differential pair and/or the transistors of the second differential pair are implemented with a size mismatch therebetween to eliminate an offset error in the transconductance amplifier due to a mismatch between the programmable lower current limit and the programmable upper current limit.

The elimination of the offset error enables programmability of an attack time and a decay time during the automatic gain control of the VGA over a wide range of the programmable current limits of the transconductance amplifier. Further, the automatic gain control circuit includes a capacitor coupled between the output of the transconductance amplifier and a ground terminal. The capacitor is configured to be charged and discharged by the transconductance amplifier.

In yet another aspect, a Radio Frequency (RF) receiver includes a mixer, a VGA to amplify an output of the mixer, and an automatic gain control circuit to control a gain of the VGA. The automatic gain control circuit includes a detector to sense an amplitude of an output of the VGA, and a comparator having an output of the detector as a first input and a reference amplitude level as a second input thereto. The comparator is configured to generate an error signal based on the first input and the second input. The automatic gain control circuit also includes a transconductance amplifier configured to have a differential voltage input based on the error signal generated through the comparator and to generate an output current. An output of the transconductance amplifier is configured to be applied to the VGA to effect an automatic gain control.

The transconductance amplifier includes a first current source associated with a programmable lower current limit of the transconductance amplifier, and a second current source associated with a programmable upper current limit of the transconductance amplifier. The transconductance amplifier also includes a first differential pair coupled to the first current source and configured to have a first voltage of the differential voltage input applied to gate terminals of transistors thereof, and a second differential pair coupled to the second current source and configured to have a second voltage of the differential voltage input applied to gate terminals of transistors thereof. The transistors of the first differential pair and/or the transistors of the second differential pair are implemented with a size mismatch therebetween to eliminate an offset error in the transconductance amplifier due to a mismatch between the programmable lower current limit and the programmable upper current limit. The elimination of the offset error enables programmability of an attack time and a decay time during the automatic gain control of the VGA over a wide range of the programmable current limits of the transconductance amplifier.

Further, the automatic gain control circuit includes a capacitor coupled between the output of the transconductance amplifier and a ground terminal. The capacitor is configured to be charged and discharged by the transconductance amplifier.

The methods and systems disclosed herein may be implemented in any means for achieving various aspects, and may be executed in a form of a machine-readable medium embodying a set of instructions that, when executed by a machine, cause the machine to perform any of the operations disclosed herein.

Other features will be apparent from the accompanying drawings and from the detailed description that follows.

DESCRIPTION OF THE DIAGRAMS

Example embodiments are illustrated by way of example and not limitation in the figures of the accompanying drawings, in which like references indicate similar elements and in which.

Other features of the present embodiments will be apparent from the accompanying drawings and from the disclosure of the various embodiments.

DETAILED DESCRIPTION

A method, a circuit and/or a system of automatic gain control with programmable attack and decay times are disclosed. In the following description, for the purposes of explanation, numerous specific details are set forth in order to provide a thorough understanding of the various embodiments. It will be evident, however to one skilled in the art that the various embodiments may be practiced without these specific details.

Figure 1:
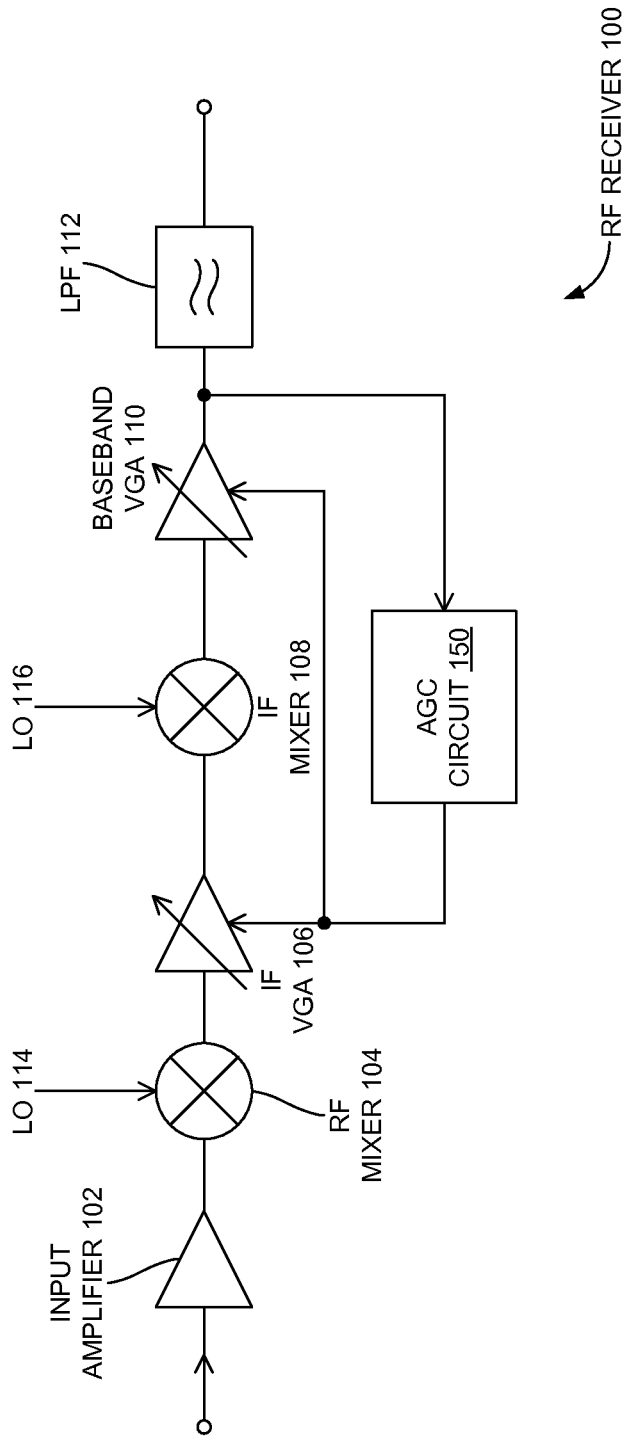
FIG. 1 is a schematic view of a Radio Frequency (RF) receiver, according to one or more embodiments.

FIG. 1 shows a Radio Frequency (RF) receiver 100, according to one or more embodiments. In one or more embodiments, RF receiver 100 may include an input amplifier 102 to amplify an input RF signal before being mixed with a signal from a local oscillator (LO) 114 through RF mixer 104 into an Intermediate Frequency (IF) component (not shown). In one or more embodiments, the IF component may be amplified to a desired level through an IF Variable Gain Amplifier (VGA) 106 before being input to an IF mixer 108 and mixed with a signal from another LO 116. In one or more embodiments, the output of IF mixer 108 may be amplified through a baseband VGA 110 before the undesired components thereof being filtered through a Low Pass Filter (LPF) 112. In one or more embodiments, an Automatic Gain Control (AGC) circuit 150 may be located in a feedback portion of IF mixer 108 to adjust the gain of IF VGA 106 and/or baseband VGA 110 to an appropriate level. In other words, the baseband output (e.g., output of baseband VGA 110, output of LPF 112) may be coupled to an input of AGC circuit 150, whose output is then applied to IF VGA 106 and baseband VGA 110. In one or more embodiments, IF VGA 106 and baseband VGA 110 may, preferably, be controlled to the same gain level.

In one or more embodiments, LO 114 and LO 116 may be generated through the same LO generator circuit. In one or more embodiments, AGC circuit 150 may be required when amplitude of the input RF signal of RF receiver 100 varies over a wide dynamic range. Thus, in one or more embodiments, AGC circuit 150 may provide a relatively constant amplitude at an output thereof so that circuitry of RF receiver 100 following AGC circuit 100 requires lesser dynamic range. For example, anti-jamming receivers (or, receivers in noisy environments) may require AGC circuit 150 to be capable of increasing the amplitude of the input RF signal at one rate, and decreasing the amplitude at a significantly different rate. Attack time may refer to the time in which AGC circuit 150 decreases the gain of IF VGA 106 and/or baseband VGA 110 when an unwanted signal appears, and decay time refers to the time in which AGC circuit 150 increases the gain of IF VGA 106 and/or baseband VGA 110 when the unwanted signal disappears.

Figure 2:
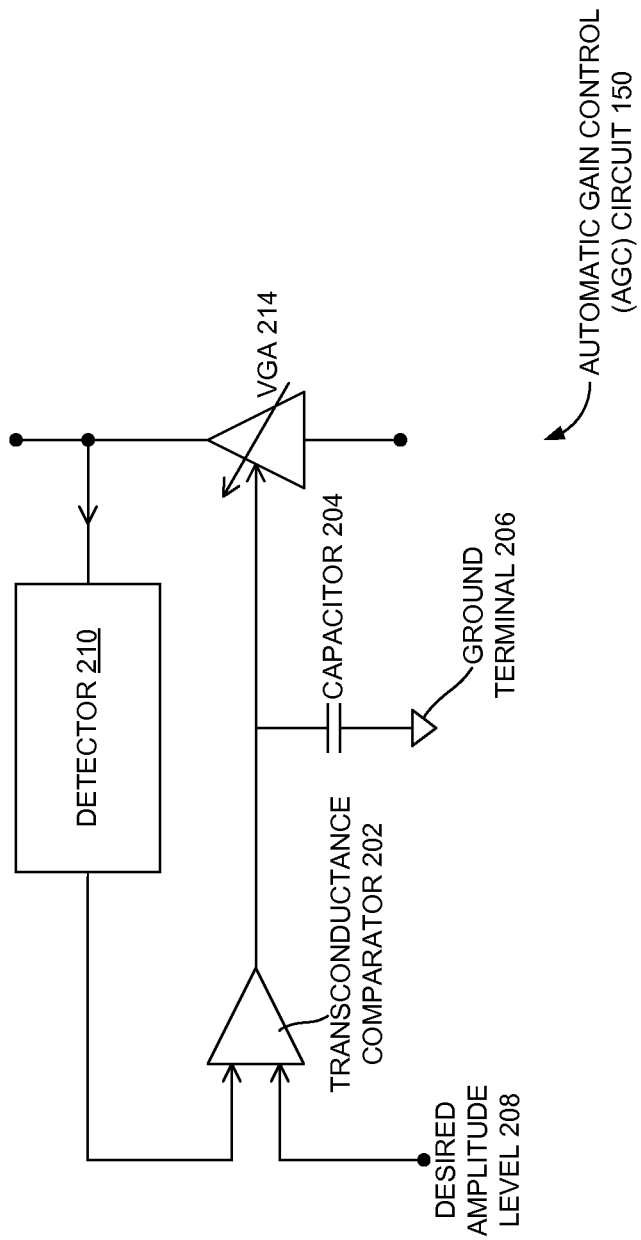
FIG. 2 is a schematic view of an Automatic Gain Control (AGC) circuit utilized in the RF receiver of FIG. 1, according to one or more embodiments.

Other applications of AGC circuit 150 may include consumer systems such as mobile phone receivers and satellite communication receivers. In scenarios such as RF receiver 100 being in a noisy environment, the rates of change of signal amplitude may need to be independently programmable, accurate and capable of varying by several orders of magnitude. FIG. 2 shows an example AGC circuit 150 having a current-limited transconductance comparator 202 with programmable current limits to charge/discharge a capacitor 204. The output of transconductance comparator 202 may be applied to a VGA 214 (e.g., IF VGA 106, baseband VGA 110), and capacitor 204 may be coupled between a path coupling transconductance comparator 202 and VGA 214 and ground (e.g., ground terminal 206). The output of VGA 214 may be fed back through a detector 210 (e.g., amplitude detector) as an input to transconductance comparator 202 that includes a desired amplitude level 208 as a reference input.

Thus, an input signal to VGA 214 may be amplified therethrough, with the gain of VGA 214 being controlled by the output of transconductance comparator 202. One or more parameters (e.g., amplitude) of the output of VGA 214 may be sensed through detector 210 and the output thereof compared with desired amplitude level 208 through transconductance comparator 202 to generate a control voltage as the output of transconductance comparator 202. Based on the control voltage, the gain of VGA 214 may be adjusted.

Figure 3:
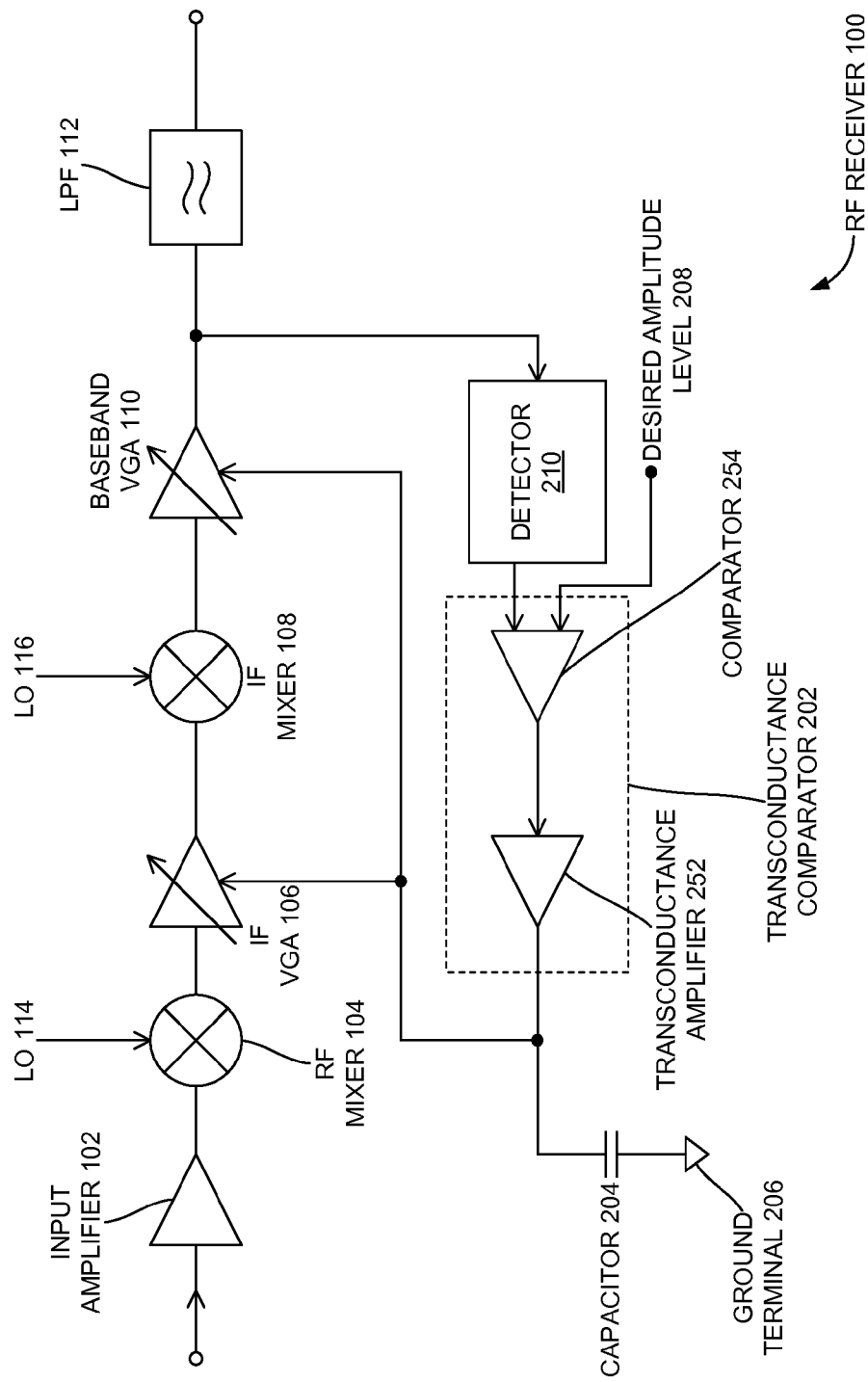
FIG. 3 is a schematic view of the RF receiver of FIG. 1 including the AGC circuit of FIG. 2, with a transconductance amplifier and a comparator being part of the transconductance comparator of FIG. 2.

In one or more embodiments, transconductance comparator 202 may include a transconductance amplifier 252 coupled to a comparator 254 stage. FIG. 3 shows RF receiver 100 as including AGC circuit 150 with transconductance amplifier 252 and comparator 254 as part of transconductance comparator 202. In FIG. 3, desired amplitude level 208 may be input to comparator 254 that compares the output of detector 210 with desired amplitude level 208. The generated error signal (or, the output of comparator 254) may be amplified through transconductance amplifier 252 to generate the control voltage discussed above.

A traditional transconductance amplifier may have an input offset that is strongly dependent on the ratio of current limits thereof. It is well known that a transconductance amplifier provides a positive or a negative current based on receiving a differential voltage as input thereto. In one or more embodiments, in order for programmability of the attack and decay times, the positive and the negative current limits of transconductance amplifier 252 may need to be made programmable to allow for differences therebetween in orders of magnitude. In the traditional transconductance amplifier, moderate differences between the positive and the negative current limits may generate large offsets, thereby causing serious errors in the amplitude control. The amplitude control errors may degrade the overall performance of a receiver including the traditional transconductance amplifier as part of automatic gain control therein.

Figure 4:
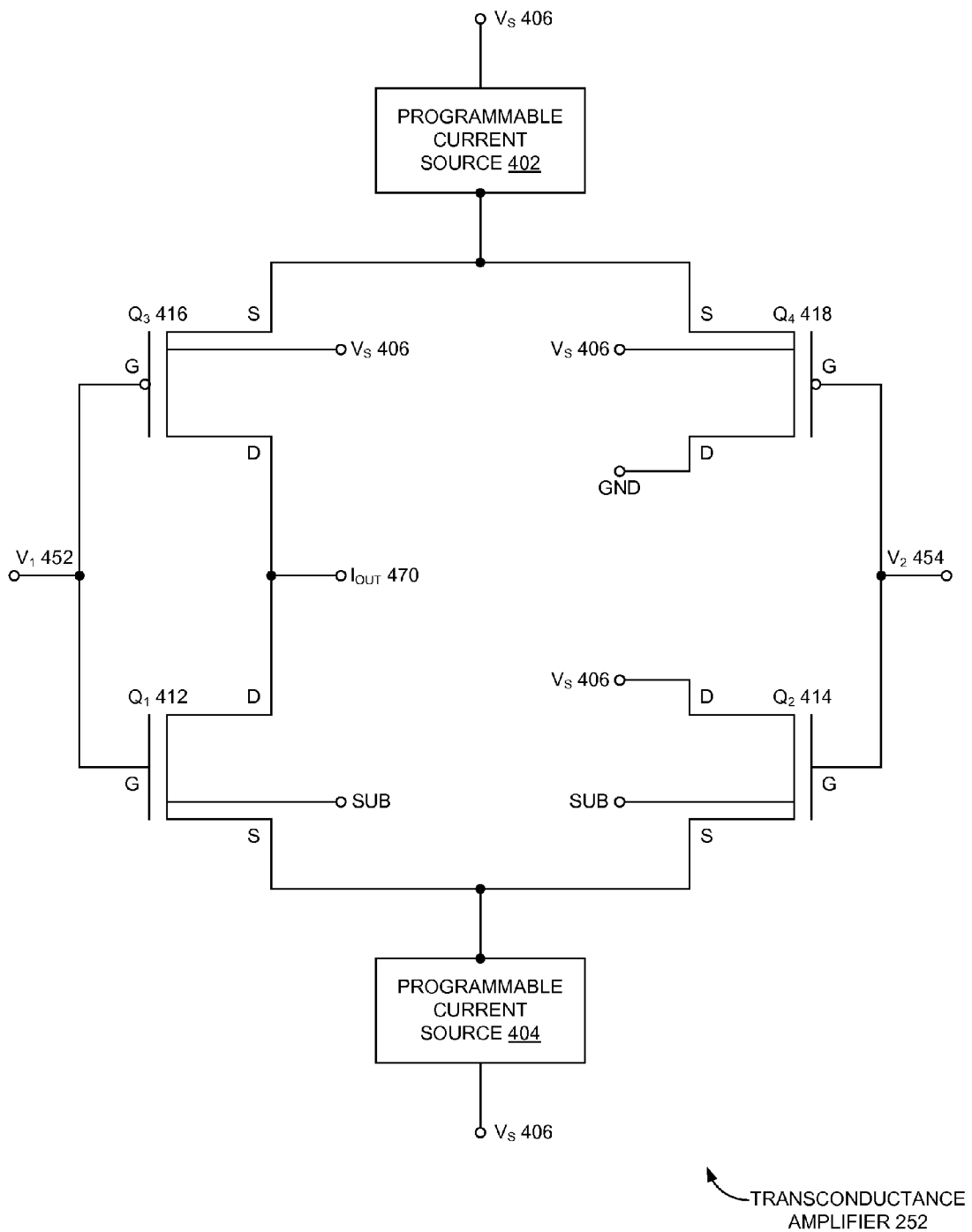
FIG. 4 is a schematic view of the transconductance amplifier of FIG. 3 having programmable current limits, according to one or more embodiments.

FIG. 4 shows transconductance amplifier 252 having programmable current limits, according to one or more embodiments. In one or more embodiments, transconductance amplifier 252 may include programmable current sources (402, 404) to set the upper and lower current limits coupled to a differential amplifier configuration. In one or more embodiments, each of programmable current source 402 and programmable current source 404 may have a supply voltage ($V_s$) 406 applied thereto and a programmable current output. For example, the current output of each programmable current source (402, 404) may be programmable based on a varying reference voltage and/or a bias current. All possible configurations of the programmable current sources (402, 404) are within the scope of the exemplary embodiments. In one or more preferable embodiments, programmable current sources (402, 404) may be implemented in an integrated circuit (IC) based solution. In one or more embodiments, programmable current source 402 may be associated with the upper current limit and programmable current source 404 may be associated with the lower current limit.

In one or more embodiments, the differential amplifier configuration of transconductance amplifier 252 providing a differential voltage to current gain function may include transistors $Q_1$ 412 and $Q_2$ 414 (e.g., n-channel Metal-Oxide-Semiconductor (MOS) transistors) in a differential pair configuration, with differential inputs $V_1$ 452 and $V_2$ 454 applied to the gate (G) terminals of $Q_1$ 412 and $Q_2$ 414 respectively. In one or more embodiments, differential inputs $V_1$ 452 and $V_2$ 454 may be derived based on the output of comparator 254. In one or more embodiments, programmable current source 404 may provide a current (lower current limit) that is divided between $Q_1$ 412 and $Q_2$ 414. In one or more embodiments, the current through each transistor $Q_1$ 412 and $Q_2$ 414 may be functions of $V_1$ 452 and $V_2$ 454. Similarly, in one or more embodiments, transconductance amplifier 252 may include transistors $Q_3$ 416 and $Q_4$ 418 (e.g., p-channel MOS transistors) in a differential pair configuration, with differential inputs $V_1$ 452 and $V_2$ 454 also applied to gate (G) terminals of $Q_3$ 416 and $Q_4$ 418 respectively. In one or more embodiments, again, programmable current source 402 may provide a current (upper current limit) that is divided between $Q_3$ 416 and $Q_4$ 418. Again, in one or more embodiments, the currents through each transistor $Q_3$ 416 and $Q_4$ 418 may be functions of $V_1$ 452 and $V_2$ 454.

In one or more embodiments, the output current ($I_{out}$) 470 of transconductance amplifier 252 may be the difference between the current flowing through $Q_3$ 416 and the current flowing through $Q_1$ 412. In one or more embodiments, $I_{out}$ 470 may be a function of ($V_1$-$V_2$). FIG. 4 shows that while the drain (D) terminals of $Q_1$ 412 and $Q_3$ 416 may be coupled to each other, the drain (D) terminal of $Q_2$ 414 may be coupled to $V_s$ 406 and the drain (D) terminal of $Q_4$ 418 may be coupled to a ground (GND) terminal. Further, the bulk (B) terminals of $Q_1$ 412 and $Q_2$ 414 may be coupled to substrate (SUB) terminals thereof. The bulk (B) terminals of $Q_3$ 416 and $Q_4$ 418 may be coupled to $V_s$ 406.

In one or more embodiments, when the upper and the lower current limits provided through programmable current sources (402, 404) do not match, an offset error (e.g., voltage offset) may be observed. In one or more embodiments, by deliberately introducing a mismatch in the sizes of transistors of the differential pairs (e.g., by implementing $Q_4$ 418 and $Q_2$ 414 as having larger sizes (e.g., 20 and 15 times respectively, at least 10 times) than that of $Q_3$ 416 and $Q_1$ 412 respectively), different currents may be made to flow through $Q_1$ 412 and $Q_2$ 414 as compared to the currents therethrough during matching upper and lower current limits. Similarly, in one or more embodiments, currents through $Q_3$ 416 and $Q_4$ 418 may be different from the currents therethrough during matching upper and lower current limits. In one or more embodiments, these current differences may enable tuning the knee voltage of $I_{out}$ 470 vs. differential input voltage ($V_1$-$V_2$) curve of transconductance amplifier 252 such that the aforementioned offset error observed during mismatches in the upper and lower current limits is considerably reduced.

While FIG. 4 discusses mismatches in sizes in both differential pairs, it is obvious that the concepts associated with exemplary embodiments are valid for a deliberate mismatch in transistor size introduced in merely one of the differential pairs. Further, it is obvious that variations in the type of the transistors (e.g., Bipolar Junction Transistors (BJTs) may be utilized instead of MOS transistors; NPN bipolar transistors may replace the n-channel MOS transistors and PNP bipolar transistors may replace the p-channel MOS transistors; combinations of MOS transistors and BJTs may also be possible) and the configurations (e.g., differential pair configurations of MOS and/or bipolar transistors) thereof are within the scope of the exemplary embodiments. Also, various implementations of programmable current sources (402, 404) and RF receiver 100 are also within the scope of the exemplary embodiments.

Thus, through the exemplary embodiments discussed above, the accuracy of amplitude control performed through AGC circuit 150 may not be degraded during mismatches in programmable upper and lower current limits of transconductance amplifier 252. Further, programmability of attack and decay times during automatic gain control may be possible through the exemplary embodiments discussed above. In one or more embodiments, transconductance amplifier 252 may be implemented with significantly reduced offset errors over a wide range of current limits to allow for a large range of programmable attack and decay times without sacrificing accuracy of the amplitude control.

Although the present embodiments has been described with reference to specific example embodiments, it will be evident that various modifications and changes may be made to these embodiments without departing from the broader spirit and scope of the various embodiments. For example, the various devices, modules, analyzers, generators, etc. described herein may be enabled and operated using hardware circuitry (e.g., CMOS based logic circuitry), firmware, software and/or any combination of hardware, firmware, and/or software (e.g., embodied in a machine readable medium).

In addition, it will be appreciated that the various operations, processes, and methods disclosed herein may be embodied in a machine-readable medium and/or a machine accessible medium compatible with a data processing system (e.g., a computer system), and may be performed in any order (e.g., including using means for achieving the various operations). Accordingly, the specification and drawings are to be regarded in an illustrative rather than a restrictive sense.

What is claimed is:

1. A transconductance comparator comprising:
   a comparator having an output of a detector configured to sense an amplitude of an output of a Variable Gain Amplifier (VGA) of a receiver as a first input and a reference amplitude level as a second input thereto, the comparator being configured to generate an error signal based on the first input and the second input; and
   a transconductance amplifier configured to have a differential voltage input based on the error signal generated through the comparator and to generate an output current, the transconductance amplifier comprising:
      a first current source associated with a programmable lower current limit of the transconductance amplifier;
      a second current source associated with a programmable upper current limit of the transconductance amplifier;
      a first differential pair coupled to the first current source and configured to have a first voltage of the differential voltage input applied to gate terminals of transistors thereof; and
      a second differential pair coupled to the second current source and configured to have a second voltage of the differential voltage input applied to gate terminals of transistors thereof,
      wherein at least one of: the transistors of the first differential pair and the transistors of the second differential pair are implemented with a size mismatch therebetween to eliminate an offset error in the transconductance amplifier due to a mismatch between the programmable lower current limit and the programmable upper current limit, the elimination of the offset error enabling programmability of an attack time and a decay time during automatic gain control of the VGA over a wide range of the programmable current limits of the transconductance amplifier.

2. The transconductance comparator of claim 1,
   wherein the first differential pair of the transconductance amplifier is implemented with at least one of n-channel Metal-Oxide-Semiconductor (MOS) transistors and NPN bipolar transistors, and
   wherein the second differential pair of the transconductance amplifier is implemented with at least one of p-channel MOS transistors and PNP bipolar transistors.

3. The transconductance comparator of claim 2,
   wherein drain terminals of a transistor of the first differential pair and a transistor of the second differential pair are coupled to each other,
   wherein source terminals of the transistors of the first differential pair are coupled to each other,
   wherein source terminals of the transistors of the second differential pair are also coupled to each other,
   wherein a drain terminal of another transistor of the first differential pair and bulk terminals of the transistors of the second differential pair are held at a supply voltage of each of the first current source and the second current source,
   wherein a drain terminal of another transistor of the second differential pair is held at a ground potential, and
   wherein bulk terminals of the transistors of the first differential pair are coupled to substrate terminals thereof.

4. The transconductance comparator of claim 3,
   wherein an output terminal of the transconductance amplifier is taken from a path coupling the drain terminals of the transistor of the first differential pair and the transistor of the second differential pair.

5. The transconductance comparator of claim 3,
   wherein at least one of the transistor of the first differential pair and the transistor of the second differential pair whose drain terminals are coupled to each other is at least 10 times smaller than the corresponding at least of the another transistor of the first differential pair and the another transistor of the second differential pair whose drain terminals are held at the supply voltage and the ground potential respectively.

6. The transconductance comparator of claim 1, wherein the current limits of the transconductance amplifier are programmable based on one of: a varying reference voltage and a varying bias current.

7. An automatic gain control circuit of a VGA comprising:
   a detector to sense an amplitude of an output of the VGA;
   a comparator having an output of the detector as a first input and a reference amplitude level as a second input thereto, the comparator being configured to generate an error signal based on the first input and the second input;
   a transconductance amplifier configured to have a differential voltage input based on the error signal generated through the comparator and to generate an output current, an output of the transconductance amplifier being configured to be applied to the VGA to effect an automatic gain control, and the transconductance amplifier comprising:
      a first current source associated with a programmable lower current limit of the transconductance amplifier;
      a second current source associated with a programmable upper current limit of the transconductance amplifier;
      a first differential pair coupled to the first current source and configured to have a first voltage of the differential voltage input applied to gate terminals of transistors thereof; and
      a second differential pair coupled to the second current source and configured to have a second voltage of the differential voltage input applied to gate terminals of transistors thereof, at least one of: the transistors of the first differential pair and the transistors of the second differential pair being implemented with a size mismatch therebetween to eliminate an offset error in the transconductance amplifier due to a mismatch between the programmable lower current limit and the programmable upper current limit, and the elimination of the offset error enabling programmability of an attack time and a decay time during the automatic gain control of the VGA over a wide range of the programmable current limits of the transconductance amplifier; and
   a capacitor coupled between the output of the transconductance amplifier and a ground terminal, the capacitor being configured to be charged and discharged by the transconductance amplifier.

8. The automatic gain control circuit of claim 7,
   wherein the first differential pair of the transconductance amplifier is implemented with at least one of n-channel MOS transistors and NPN bipolar transistors, and
   wherein the second differential pair of the transconductance amplifier is implemented with at least one of p-channel MOS transistors and PNP bipolar transistors.

9. The automatic gain control circuit of claim 8,
wherein drain terminals of a transistor of the first differential pair of the transconductance amplifier and a transistor of the second differential pair of the transconductance amplifier are coupled to each other,
wherein source terminals of the transistors of the first differential pair of the transconductance amplifier are coupled to each other,
wherein source terminals of the transistors of the second differential pair of the transconductance amplifier are also coupled to each other,
wherein a drain terminal of another transistor of the first differential pair of the transconductance amplifier and bulk terminals of the transistors of the second differential pair of the transconductance amplifier are held at a supply voltage of each of the first current source and the second current source thereof,
wherein a drain terminal of another transistor of the second differential pair of the transconductance amplifier is held at a ground potential, and
wherein bulk terminals of the transistors of the first differential pair of the transconductance amplifier are coupled to substrate terminals thereof.

10. The automatic gain control circuit of claim 9,
wherein an output terminal of the transconductance amplifier is taken from a path coupling the drain terminals of the transistor of the first differential pair and the transistor of the second differential pair thereof.

11. The automatic gain control circuit of claim 9,
wherein at least one of the transistor of the first differential pair of the transconductance amplifier and the transistor of the second differential pair of the transconductance amplifier whose drain terminals are coupled to each other is at least 10 times smaller than the corresponding at least one of the another transistor of the first differential pair of the transconductance amplifier and the another transistor of the second differential pair of the transconductance amplifier whose drain terminals are held at the supply voltage and the ground potential respectively.

12. A Radio Frequency (RF) receiver comprising:
a mixer;
a VGA to amplify an output of the mixer; and
an automatic gain control circuit to control a gain of the VGA, the automatic gain control circuit comprising:
a detector to sense an amplitude of an output of the VGA;
a comparator having an output of the detector as a first input and a reference amplitude level as a second input thereto, the comparator being configured to generate an error signal based on the first input and the second input;
a transconductance amplifier configured to have a differential voltage input based on the error signal generated through the comparator and to generate an output current, an output of the transconductance amplifier being configured to be applied to the VGA to effect an automatic gain control, and the transconductance amplifier comprising:
a first current source associated with a programmable lower current limit of the transconductance amplifier;
a second current source associated with a programmable upper current limit of the transconductance amplifier;
a first differential pair coupled to the first current source and configured to have a first voltage of the differential voltage input applied to gate terminals of transistors thereof; and
a second differential pair coupled to the second current source and configured to have a second voltage of the differential voltage input applied to gate terminals of transistors thereof, at least one of: the transistors of the first differential pair and the transistors of the second differential pair being implemented with a size mismatch therebetween to eliminate an offset error in the transconductance amplifier due to a mismatch between the programmable lower current limit and the programmable upper current limit, and the elimination of the offset error enabling programmability of an attack time and a decay time during the automatic gain control of the VGA over a wide range of the programmable current limits of the transconductance amplifier; and
a capacitor coupled between the output of the transconductance amplifier and a ground terminal, the capacitor being configured to be charged and discharged by the transconductance amplifier.

13. The RF receiver of claim 12, wherein the mixer is an Intermediate Frequency (IF) mixer.

14. The RF receiver of claim 13, further comprising:
a RF mixer to mix an RF input with a local oscillator (LO) signal; and
another VGA to amplify an output of the RF mixer,
wherein the automatic gain control circuit is also configured to control a gain of the another VGA.

15. The RF receiver of claim 12, wherein the RF receiver is one of an anti-jamming receiver, a consumer system receiver and a satellite communication receiver.

16. The RF receiver of claim 14, wherein the automatic gain control circuit to configured to control the gain of the VGA at a same level as the gain of the another VGA.

17. The RF receiver of claim 12,
wherein the first differential pair of the transconductance amplifier is implemented with at least one of n-channel MOS transistors and NPN bipolar transistors, and
wherein the second differential pair of the transconductance amplifier is implemented with at least one of p-channel MOS transistors and PNP bipolar transistors.

18. The RF receiver of claim 17,
wherein drain terminals of a transistor of the first differential pair of the transconductance amplifier and a transistor of the second differential pair of the transconductance amplifier are coupled to each other,
wherein source terminals of the transistors of the first differential pair of the transconductance amplifier are coupled to each other,
wherein source terminals of the transistors of the second differential pair of the transconductance amplifier are also coupled to each other,
wherein a drain terminal of another transistor of the first differential pair of the transconductance amplifier and bulk terminals of the transistors of the second differential pair of the transconductance amplifier are held at a supply voltage of each of the first current source and the second current source thereof,
wherein a drain terminal of another transistor of the second differential pair of the transconductance amplifier is held at a ground potential, and
wherein bulk terminals of the transistors of the first differential pair of the transconductance amplifier are coupled to substrate terminals thereof.

19. The RF receiver of claim 18,
wherein an output terminal of the transconductance amplifier is taken from a path coupling the drain terminals of the transistor of the first differential pair and the transistor of the second differential pair thereof.

20. The RF receiver of claim 18,
wherein at least one of the transistor of the first differential pair of the transconductance amplifier and the transistor of the second differential pair of the transconductance amplifier whose drain terminals are coupled to each other is at least 10 times smaller than the corresponding at least one of the another transistor of the first differential pair of the transconductance amplifier and the another transistor of the second differential pair of the transconductance amplifier whose drain terminals are held at the supply voltage and the ground potential respectively.

* * * * *